United States Patent
Jensen

(10) Patent No.: US 9,923,256 B2
(45) Date of Patent: Mar. 20, 2018

(54) RIDGE LOADED WAVEGUIDE COMBINER/DIVIDER

(71) Applicant: ViaSat, Inc., Carlsbad, CA (US)

(72) Inventor: Anders Jensen, Johns Creek, GA (US)

(73) Assignee: VIASAT, INC., Carlsbad, CA (US)

( * ) Notice: Subject to any disclaimer, the term of this patent is extended or adjusted under 35 U.S.C. 154(b) by 112 days.

(21) Appl. No.: 14/634,185

(22) Filed: Feb. 27, 2015

(65) Prior Publication Data
US 2016/0254582 A1 Sep. 1, 2016

(51) Int. Cl.
| | |
|---|---|
| *H01Q 21/00* | (2006.01) |
| *H01P 3/123* | (2006.01) |
| *H01P 5/12* | (2006.01) |
| *H01P 5/20* | (2006.01) |
| *G06F 17/50* | (2006.01) |

(52) U.S. Cl.
CPC .............. *H01P 3/123* (2013.01); *G06F 17/50* (2013.01); *H01P 5/12* (2013.01); *H01P 5/20* (2013.01); *H01Q 21/0037* (2013.01)

(58) Field of Classification Search
CPC ... G06F 17/50; H01P 5/12; H01P 5/20; H01Q 21/0037
See application file for complete search history.

(56) References Cited

U.S. PATENT DOCUMENTS

| | | | |
|---|---|---|---|
| 3,315,183 A | 4/1967 | Bunn et al. | |
| 3,375,472 A | 3/1968 | Walker | |
| 3,471,857 A * | 10/1969 | Schwartz | G01S 13/4409 342/153 |
| 3,629,734 A * | 12/1971 | Siekanowicz | H01P 5/20 333/122 |
| 3,918,011 A | 11/1975 | Salzberg | |
| 4,039,975 A | 8/1977 | Debski | |
| 4,642,586 A * | 2/1987 | Fowler | H01P 5/20 333/122 |
| 4,956,622 A | 9/1990 | de Ronde | |

(Continued)

FOREIGN PATENT DOCUMENTS

| | | |
|---|---|---|
| EP | 3062384 A1 | 8/2016 |
| GB | 650615 A | 2/1951 |

OTHER PUBLICATIONS

Extended European Search Report mailed in European Patent Application No. 16157439.7 dated Jul. 21, 2016, 10 pgs.

(Continued)

*Primary Examiner* — Jessica Han
*Assistant Examiner* — Jae Kim
(74) *Attorney, Agent, or Firm* — Snell & Wilmer L.L.P.

(57) ABSTRACT

In an example embodiment, a waveguide combiner/divider comprises: a first waveguide including a first major ridge extending to a waveguide junction; a second waveguide including a second major ridge extending to the waveguide junction, the second major ridge connected to the first major ridge at a major ridge junction within the waveguide junction; and a third waveguide including a third major ridge extending to the waveguide junction, the third major ridge connected to the major ridge junction via a major ridge transition section, the major ridge transition section having a major ridge transition section height within the waveguide junction that is less than heights of the first major ridge and second major ridge.

29 Claims, 8 Drawing Sheets

(56) References Cited

U.S. PATENT DOCUMENTS

| | | | |
|---|---|---|---|
| 5,047,738 A | 9/1991 | Wong et al. | |
| 9,343,795 B1* | 5/2016 | Halligan | H01P 5/16 |
| 2007/0262835 A1 | 11/2007 | Vanin et al. | |
| 2013/0141186 A1* | 6/2013 | Nguyen | H01P 5/12 |
| | | | 333/137 |
| 2013/0321096 A1* | 12/2013 | Fahmi | H01P 5/12 |
| | | | 333/108 |
| 2014/0049335 A1* | 2/2014 | Kroening | H01P 1/39 |
| | | | 333/1.1 |

OTHER PUBLICATIONS

Chu et al., "A Ka-Band E-Plane Waveguide Magic-T With Coplanar Arms", IEEE Transactions on Microwave Theory and Techniques, vol. 62, No. 11, Nov. 2014, pp. 2673-2679.

* cited by examiner

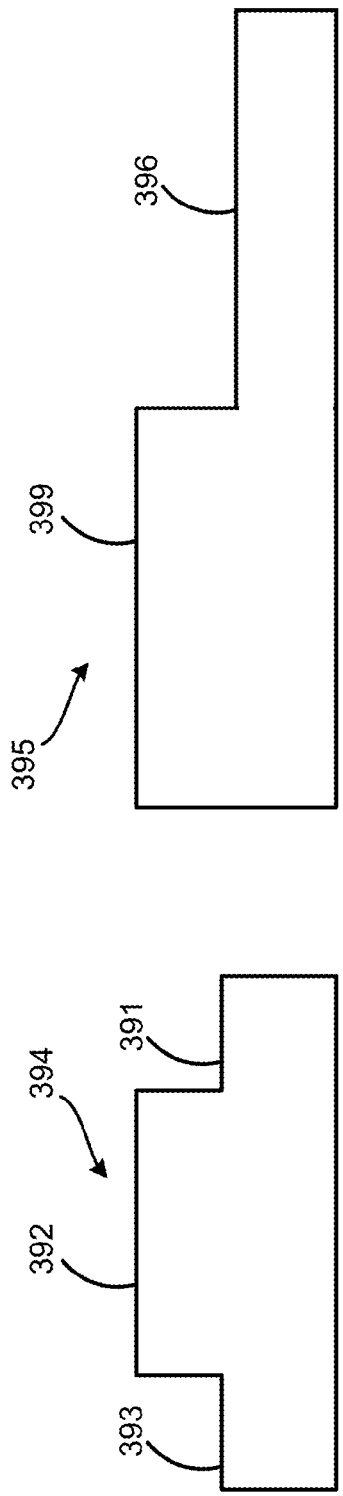
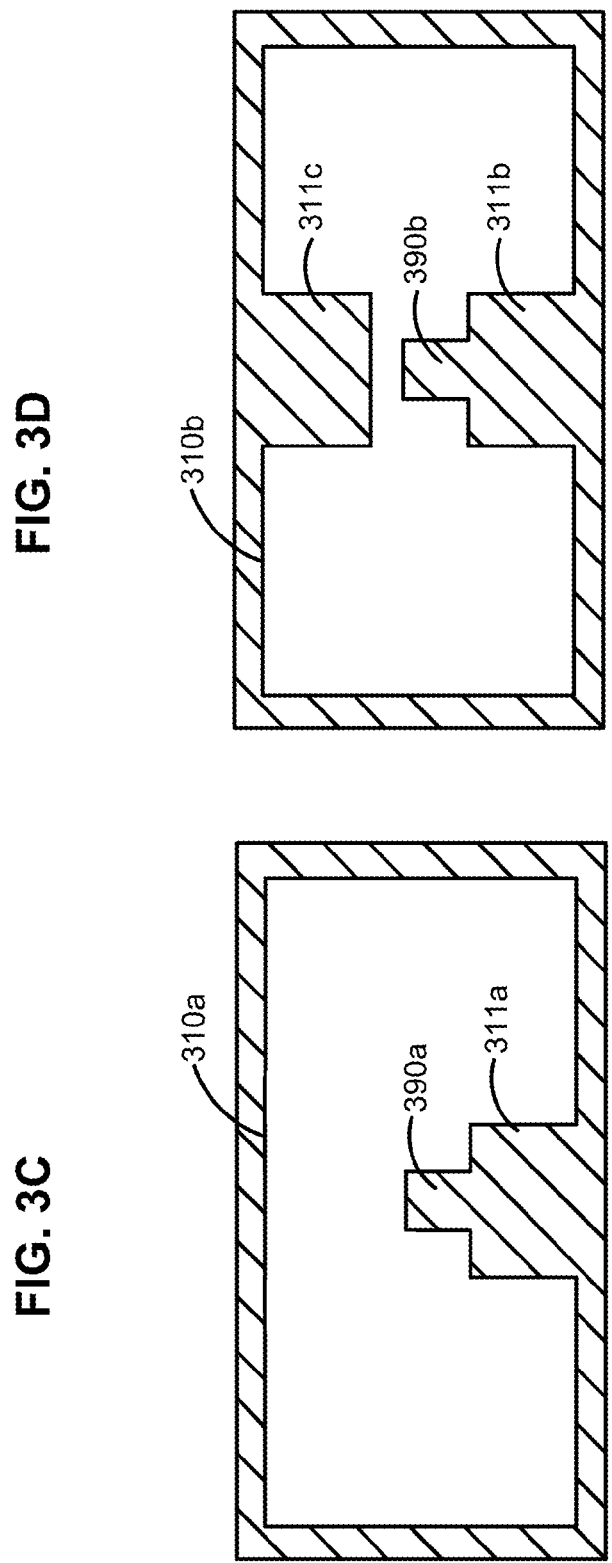

RIDGE LOADED WAVEGUIDE COMBINER/DIVIDER

FIELD

The present disclosure relates generally to radio frequency (RF) antenna devices, and more specifically waveguide junctions.

BACKGROUND

Various RF antenna devices include a beam forming network having waveguide dividers/combiners to divide/combine signals between a common port and an array of antenna elements. As the number of elements in an antenna array increases, the number of junctions increases and the waveguide divider/combiner structure becomes increasingly complex and space consuming. Furthermore, for large operational frequency bandwidths, the performance of the power divider/combiners may limit the overall performance of the antenna device. For example, variation in the output phase and amplitude of the waveguide dividers/combiners across the operational frequency bands may limit the radiation efficiency and sidelobe performance of the antenna device.

Various traditional waveguide junction power dividers have limited bandwidth and/or power split ratio capabilities. Interleaved waveguide networks tend to be complex, costly, and too heavy for some (e.g., mobile) applications. For example, magic tees having a fourth non-planar port are not suitable for integration into compact layered structures.

SUMMARY

In an example embodiment, a waveguide combiner/divider comprises: a first waveguide including a first major ridge extending to a waveguide junction; a second waveguide including a second major ridge extending to the waveguide junction, the second major ridge connected to the first major ridge at a major ridge junction within the waveguide junction; and a third waveguide including a third major ridge extending to the waveguide junction. The third major ridge is connected to the major ridge junction via a major ridge transition section, the major ridge transition section having a major ridge transition section height within the waveguide junction that is less than heights of the first major ridge and second major ridge.

In another example embodiment, a method of designing a waveguide combiner/divider comprises: designing a first waveguide including a first major ridge extending to a waveguide junction; designing a second waveguide including a second major ridge extending to the waveguide junction, the second major ridge connected to the first major ridge at a major ridge junction within the waveguide junction; designing a third waveguide including a third major ridge extending to the waveguide junction, the third major ridge connected to the major ridge junction via a major ridge transition section; and iteratively adjusting a major ridge transition section height of the major ridge transition section and calculating a corresponding power split ratio between the second and third waveguides until the calculated power split ratio reaches a particular value.

In another example embodiment, an antenna comprises: an array of antenna elements; a beam forming network to communicate signals with the array of antenna elements, the beam forming network including a first waveguide combiner/divider and a second waveguide combiner/divider along a signal path between a particular antenna element of the array of antenna elements and a common port. In this example embodiment, each of the first and second waveguide combiner/dividers comprise: a first waveguide including a first major ridge extending to a waveguide junction; a second waveguide including a second major ridge extending to the waveguide junction, the second major ridge connected to the first major ridge at a major ridge junction within the waveguide junction; and a third waveguide including a third major ridge extending to the waveguide junction. The third major ridge is connected to the major ridge junction via a major ridge transition section. The major ridge transition section has a major ridge transition section height within the waveguide junction that is less than heights of the first major ridge and second major ridge.

BRIEF DESCRIPTION OF THE DRAWING FIGURES

FIGS. 1A and 1B, respectively, are top and perspective views of an example waveguide combiner/divider;

FIGS. 2A, 2B, 2C, 2D and 2E include cross-sectional views of example waveguides of example waveguide combiners/dividers;

FIGS. 2F, 2G, 2H and 2I include side views of example major ridge transition sections of example waveguide combiners/dividers;

FIGS. 3A and 3B, respectively, are top and perspective views of another example waveguide combiner/divider having an example minor ridge;

DETAILED DESCRIPTION

Figure 1A:
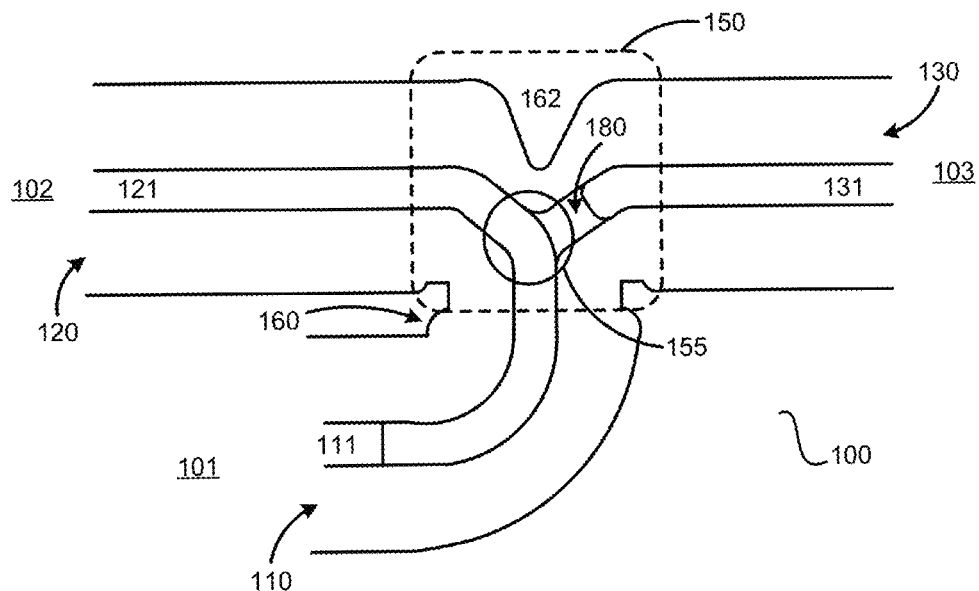

Reference will now be made to the example embodiments illustrated in the drawings, and specific language will be used herein to describe the same. It will nevertheless be understood that no limitation of the scope of the disclosure is thereby intended. Alterations and further modifications of the features illustrated herein, and additional applications of the principles illustrated herein, which would occur to one skilled in the relevant art and having possession of this disclosure, are to be considered within the scope of the disclosure.

In an example embodiment, a waveguide combiner/divider comprises three waveguides and a waveguide junction. The three waveguides are ridge loaded. In other words, each waveguide comprises a major ridge extending to the waveguide junction. Furthermore, in this example embodiment, the second major ridge is connected to the first major ridge at a major ridge junction within the waveguide junction, and the third major ridge is connected to the major ridge junction via a major ridge transition section. In this example embodiment, the major ridge transition section has a major ridge transition section height within the waveguide junction that is less than heights of the first major ridge and second major ridge.

Figure 1B:
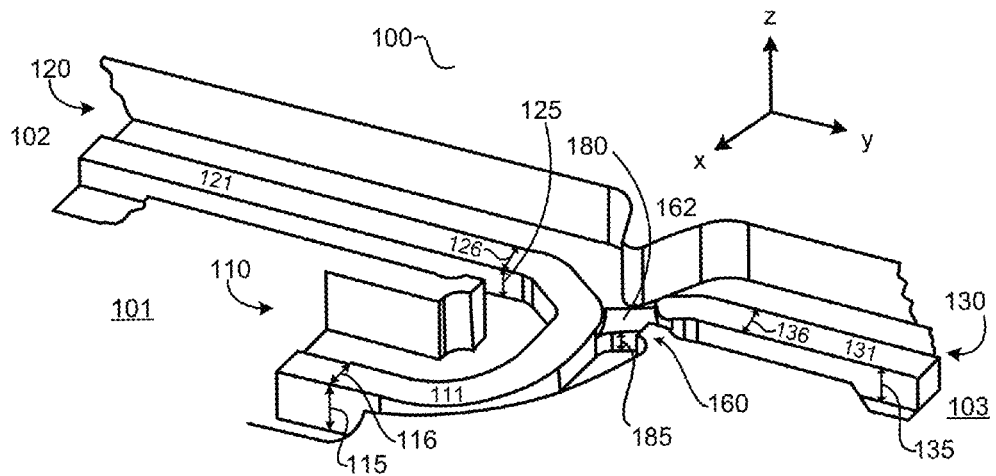

FIGS. 1A and 1B, respectively, are top and perspective views of an example waveguide combiner/divider 100. The waveguide combiner/divider 100 comprises a first waveguide 110, a second waveguide 120, a third waveguide 130, and a waveguide junction 150. First waveguide 110 includes a first major ridge 111 extending to the waveguide junction 150. Second waveguide 120 includes a second major ridge 121 extending to the waveguide junction 150. Third waveguide 130 includes a third major ridge 131 extending to the waveguide junction 150. In the illustrated embodiment, second major ridge 121 is connected to first major ridge 111 at a major ridge junction 155 within waveguide junction 150, and third major ridge 131 is connected to major ridge junction 155 via a major ridge transition section 180.

In the illustrated embodiment, the first, second and third major ridges (111, 121, 131) each have first, second and third major ridge widths (116, 126, and 136, respectively). In an example embodiment, the first, second and third major ridge widths (116, 126, 136) are equal to one another throughout waveguide combiner/divider 100.

In the illustrated embodiment, major ridge transition section 180 has a major ridge transition section height 185 within the waveguide junction that is less than the major ridge heights (115, 125, and 135, respectively) of the first major ridge 111, second major ridge 121, and third major ridge 131. In the illustrated embodiment, the heights of first major ridge 111 and second major ridge 121 are the same at major ridge junction 155. In the illustrated embodiment, the height of the major ridges (111, 121, 131) along the length of the waveguides are constant (except at major ridge transition section 180). Stated another way, outside of waveguide junction 150, the first, second, and third major ridges (111, 121, and 131, respectively) have the same major ridge heights. However, inside of waveguide junction 150 there is a difference in the major ridge height between at least one of the ridges (e.g., 131) and the other two ridges (e.g., 111, 121). In the illustrated embodiment, first major ridge 111 and second major ridge 121 have the same height both within waveguide junction 150 and outside of waveguide junction 150, and the height of the third major ridge 131 outside of waveguide junction 150 is the same as the height of the first major ridge 111, but inside of waveguide junction 150 (e.g., at major ridge transition section 180), the height of third major ridge 131 may vary and/or be less than the height of the major ridges (111, 121, 131) outside of waveguide junction 150.

Power Split Ratios

In various embodiments, the relative difference between major ridge transition section height 185 and the major ridge heights (115, 125, and 135) of the first major ridge 111, second major ridge 121, and third major ridge 131 (respectively) is directly related to the power ratio of the waveguide combiner/divider 100. Therefore, during design of a beam forming network, unequal power ratios can be used in various waveguide combiner/dividers 100, and major ridge transition section height 185 can be selected to create the appropriate power ratio using the techniques described herein. Thus, in one beam forming network, various waveguide combiner/dividers 100, located in a signal path, can each have major ridge transition section heights 185 that vary from one waveguide combiner/divider to another. This power ratio is now described in greater detail.

As mentioned above, the waveguide combiner/divider 100 is a reciprocal device that can be used as a combiner and/or a divider. The term "power ratio" as used herein refers to the power split ratio when the waveguide combiner/divider 100 is used as a divider, and refers to the power combining ratio when used as a combiner. When used as a divider, the power split ratio of the waveguide combiner/divider 100 is the ratio of the power output at one of the second and third waveguide ports (102, 103) to the power output at the other of the second and third waveguide ports (102, 103) due to a signal incident on the first waveguide port 101. When used as a combiner, the power combing ratio is the ratio of the power output at the first waveguide port 101 due to a signal incident on the second waveguide port 102, to the power output at the first waveguide port due to the same signal incident on the third waveguide port 103. The value of the power ratio can vary from embodiment to embodiment. As described in more detail below, the power split ratio between second waveguide 120 and third waveguide 130 is based at least in part on relative difference between major ridge transition section height 185 and the heights (115, 125) of first major ridge 111 and second major ridge 121.

In an example embodiment, major ridge transition section height 185 may be 0 to 100% of major ridge heights (115, 125, 135), depending on a desired power split ratio. For a power split ratio of approximately 0 dB, major ridge transition section height 185 can be very close to 100% of major ridge heights (115, 125, 135). A power split ratio of 0 dB may also be referred to as an "equal-way" combiner/divider, where an equal amount of power appears at the output ports (102, 103) when used as a divider. In one embodiment, a major ridge transition section height 185 of 0% (i.e. a complete gap in the ridge) provides a maximum power split ratio of approximately 6.4 dB. The maximum power split ratio can vary from embodiment to embodiment based on the amount of ridge loading. It has been observed that an increase in ridge loading will provide an increase in maximum achievable power split ratio.

In an example embodiment, major ridge transition section 180 is on the lower power side of the split. Thus, in an example embodiment, third waveguide port 103 is a low side port and second waveguide port 102 is a high side port, and major ridge transition section 180 is in the waveguide corresponding to the low side port. Stated another way, third waveguide port 103 is a cold side port and second waveguide port 102 is a hot side port, and major ridge transition section 180 is in the waveguide corresponding to the cold side port. Stated another way, third waveguide port 103 is a low power port and second waveguide port 102 is a high power port, and major ridge transition section 180 is in the waveguide corresponding to the low power port. Stated yet another way, third waveguide 130 is weakly coupled and second waveguide 120 is strongly coupled, and major ridge transition section 180 is in the weakly coupled waveguide. The deeper the step, the less the coupling to the third waveguide 130.

Moreover, major ridge transition section 185 can have any suitable height, length, and/or shape for: changing impedance, bleeding more or less energy into third waveguide 130 (in transmit mode), providing more degrees of freedom in designing the junction, fine tuning, controlling the phase response, compensating for amplitude imbalance.

Waveguides

In the illustrated embodiment, the waveguide combiner/divider 100 is a three port device. For example, waveguide combiner/divider 100 comprises a first waveguide port 101, a second waveguide port 102, and a third waveguide port 103. First waveguide port 101 corresponds to first waveguide 110, second waveguide port 102 corresponds to second waveguide 120, and third waveguide port 103 corresponds to third waveguide 130.

The waveguide combiner/divider 100 is a reciprocal device that may be used as a waveguide combiner and/or a waveguide divider. In one example embodiment, waveguide combiner/divider 100 is a waveguide divider. In this example embodiment, first waveguide port 101 is an input port, and second waveguide port 102 and third waveguide port 103 are output ports. In this embodiment, waveguide combiner/divider 100 divides a signal (e.g., a transmit signal) in first waveguide 110 into a first divided signal in second waveguide 120 and a second divided signal in third waveguide 130. In this example embodiment, the second divided signal and the third divided signal are in-phase with one another at a plurality of frequencies.

In another example embodiment, waveguide combiner/divider 100 is a waveguide combiner. In this example embodiment, second waveguide port 102 and third waveguide port 103 are input ports, and first waveguide port 101 is an output port. In this embodiment, waveguide junction 150 combines a first input signal in second waveguide 120 in-phase with a second input signal in third waveguide 130 at a plurality of frequencies to form an output signal (e.g., a receive signal) in first waveguide 110.

As used herein, "in-phase" is defined as being at least within 4 electrical degrees of having a zero degree phase difference. In an example embodiment, the waveguide combiner/divider 100, acting as a divider, is configured such that microwave signals in a first frequency band are in-phase with each other at the second and third waveguide ports, and microwave signals in a second frequency band are in-phase with each other at the second and third waveguide ports. In another example embodiment, the waveguide combiner/divider 100, acting as a combiner, combines signals, received at second and third waveguide ports (102, 103), without introducing a phase difference in combining the signals. In this example, the first band is a receive frequency band. In an example embodiment, the receive frequency band is from 17.7 to 21.2 GHz, or from 18.3 to 20.2 GHz. Moreover, the receive frequency band can be any suitable frequency band.

Similarly, in an example divider embodiment, the second band is a transmit frequency band, and a first transmit signal transmitted from the second port is in-phase with a second transmit signal transmitted from the third port. In an example embodiment, the transmit frequency band is from 27.5 to 31.0 GHz, from 27.5 to 30.0 GHz, or from 28.1 to 30.0 GHz. Moreover, the transmit frequency band can be any suitable frequency band. In another embodiment, the waveguide combiner/divider is simultaneously operated as a combiner in a first band of frequencies and operating as a divider in a second band of frequencies. The first band of frequencies may, for example, be from 17.7 to 21.2 GHz, and the second band of frequencies may, for example, be from 27.5 to 31.0 GHz.

For simplicity, first waveguide port 101 may be referred to herein as a common port of the waveguide combiner/divider 100, and second waveguide port 102 and third waveguide port 103 may respectively be referred to herein as coupled ports. The common port is an input port in a waveguide power divider and an output port in a waveguide power combiner. In yet another example embodiment, waveguide combiner/divider 100 is both a waveguide power divider and a waveguide power combiner. For example, waveguide combiner/divider 100 can be used in conjunction with an RF transceiver for simultaneously transmitting and receiving RF signals.

In one example embodiment, the difference in frequency between the receive frequency band and the transmit frequency band is greater than 1.5. Stated another way, the in-phase condition can be maintained over a wide frequency band and can be achieved over RF bandwidths exceeding a ratio of 1.5:1. In another example embodiment, the in-phase condition can be maintained over RF bandwidths exceeding a ratio of 1.75:1, such as over an operational band from 17.7 GHz to 31.0 GHz.

A Cartesian coordinate system can be useful for describing the relative relationships and orientations of waveguides (110, 120, 130), ports (101, 102, 103), major ridges (111, 121, 131), major ridge transition section 180, and/or a minor ridge 190. The coordinate system can comprise an X axis, a Y axis, and a Z axis, wherein each axis is perpendicular to the other two axes. In an example embodiment, each of first, second, and third waveguides (110, 120, 130) comprises an elongate rectangular waveguide. These waveguides are each located in a plane(s) that are parallel to a plane containing the X and Y axis. The waveguides each have a width in the X-Y plane, and a height in the Z direction.

In an example embodiment, first waveguide 110, second waveguide 120, and third waveguide 130 are each rectangular waveguides. In other example embodiments, the waveguides are non-rectangular waveguides, such as polygon in shape. In the illustrated embodiment, waveguide combiner/divider 100 comprises single ridge-loaded rectangular waveguides at the three input/output ports. In one embodiment, for example, the width of the first, second, and third waveguides can be equal to each other. The waveguides illustrated can each be wider (i.e., in the X or Y directions) than they are tall (i.e., in the Z direction). In an example embodiment, the waveguide common port and the waveguide coupled ports are of similar or equal width. This facilitates use across a broad band of frequencies. However, in other example embodiments, the waveguide width of the common port can differ from that of the other two ports.

Each of the first, second and third waveguide ports (101, 102, 103) can be configured for receiving or providing an RF signal to a connected waveguide. It should be noted that generally the waveguide combiner/divider 100 can be integrally formed with "connected" waveguides, such that the waveguide combiner/divider 100 inputs/outputs are located at any suitable point away from the junction of the three waveguides. Furthermore, the "connected" waveguides can bend, turn, step up or down, jog, and/or shift to other planes or orientations. By way of example, waveguide combiner/divider 100 can have an H-plane bend in the common waveguide 110 just before the junction. An H-plane bend can lie in the X-Y plane and be co-planar with waveguide junction 150. As another example, waveguide combiner/divider 100 can have an E-plane waveguide jog at the input in common waveguide 110. An E-plane waveguide jog can have an interface that is perpendicular to the X-Y plane to provide for transitioning to a different layer. In another example embodiment, first waveguide 110 may have no ridge leading into common port 101, then step up into the major ridge 111 before entering into waveguide junction 150.

In an example embodiment, waveguides (110, 120, 130), can be sized for dominant mode signal transmission where the width and height of the waveguide can have a dimension (width "a" and height "b") where "a" is greater than $\lambda_{C_1}/2$ and less than $\lambda_{C_2}/2$ where $\lambda_{C_1}$ is the (dominant) first cutoff mode wavelength of the ridged waveguide structure and $\lambda_{C_2}$ is the corresponding second mode cutoff. The ridged waveguide mode cutoff values are waveguide geometry dependent and for rectangular waveguides the relationship $\lambda_{C_1} > 2a$ and $\lambda_{C_2} > 4a$ where "2a" and "4a" are the unloaded first and second mode cutoff wavelength values, respectively. Waveguide height "b" can be selected to be less than "a" to avoid a degenerate or higher order mode of signal transmission. In an example embodiment, the lower frequency limit can establish a lower limit to the waveguide size as it is the "waveguide cutoff" where signal transmission effectively ceases. In practical applications it can be desirable for the waveguide size to be selected to avoid operation less than 8% above the cutoff value ($\lambda_L$>1.08$\lambda_{C1}$) where $\lambda_L$ is the free-space wavelength at the lowest operational frequency value, because, for example, the loss can increase as the cutoff value ($\lambda$=$\lambda_{C1}$) is approached. In applications where there is significant length of waveguide involved in the power distribution network, the lower limit can be constrained to be 12% above the cutoff value ($\lambda_L$>1.12$\lambda_{C1}$). In an example embodiment, the higher frequency limit ($\lambda_H$<$\lambda_{C2}$) where $\lambda_H$ is the free-space wavelength at the highest operational frequency value can restrict higher order mode transmission that can be deleterious to the objective signal transmission performance. The specific sizing and geometry of waveguide can vary from embodiment to embodiment, and may depend on multiple factors including performance, size, weight, and techniques for manufacturing. Practically it can be useful to define a margin below the limit and this margin is tied to the achievable manufacturing tolerances. For precision manufacturing a limit can be defined that is 2% below the theoretical value ($\lambda_H$<0.98$\lambda_{C2}$). Thus, as a practical limit, the rectangular waveguide can be configured, in an example embodiment, to operate over a band or set of bands that have a ratio of the highest frequency to the lowest frequency of (2*0.98/1.08=) 1.815 and typically no more than (2*0.98/1.12=) 1.75 for applications involving significant lengths of waveguide and precision manufacturing technology. Conventional or standard waveguide bands are defined with ratios of 1.5 (e.g., encompassing 12-18 GHz).

Waveguide Junction

The waveguide junction 150 is the location of connection of first waveguide 110, second waveguide 120 and third waveguide 130. A portion of the first waveguide 110 outside and nearest the waveguide junction 150 has a uniform cross-section along its length. Similarly, a portion of the second waveguide 120 outside and nearest the waveguide junction 150 has a uniform cross-section its length, and a portion of the third waveguide 130 outside and nearest the waveguide junction 150 has a uniform cross-section along its length. In other words, the boundaries of the waveguide junction 150 are the locations where the respective cross-sections of each of the first, second and third waveguides 110, 120, 130 are no longer changing. In the illustrated embodiment, these cross-sections are in planes perpendicular to the X-Y plane.

In an example embodiment, outside of the waveguide junction 150, the first, second, and third waveguides (110, 120, 130, respectively) have the same heights and have the same widths. It is noted that these heights may be different than these widths, and generally height may be less than width. In the illustrated embodiment, the waveguide combiner/divider 100 is an H-plane junction in which the broad walls of the waveguides (110, 120, 130) remain in the same plane. In doing so, the waveguide combiner/divider 100 can be arranged in a planar assembly that includes multiple waveguide combiner/dividers 100. In the illustrated embodiment, the waveguide combiner/divider 100 is a Y-junction. In an alternative embodiment, the waveguide combiner/divider 100 is a T-junction. Other embodiments can include blended combinations of Y-junction and/or T-junctions.

Septum

In accordance with another example embodiment, waveguide combiner/divider 100 comprises a septum 162. In an example embodiment, septum 162 is an H-plane septum. The septum 162 can extend from the "floor" of the waveguide to the "ceiling" of the waveguide in the "height" direction and is generally perpendicular to the "width" direction of the input waveguide. In an example embodiment, waveguide combiner/divider 100 is considered to have a top wall located at the top of the waveguide. This top wall is the wall facing parallel to the longitudinal axis of the second and third waveguides. The H-plane septum can extend from this "top" wall of the T, in the direction perpendicular to the longitudinal axis of the second and third waveguides. Thus, septum 162 is substantially vertical, or in other words parallel with the Y-Z plane. In an example embodiment, septum 162 is configured to divide the signal from the common waveguide. Moreover, the septum can be any suitable septum for additional amplitude control, phase equalization and matching. For example, the septum 162 may be smooth. As another example, the septum 162 may include stepped and/or piece-wise smooth features (not shown).

Iris

In an example embodiment, waveguide combiner/divider 100 further includes an iris 160 within the waveguide junction 150. Iris 160 can comprise a slight narrowed neck on the sidewalls of first waveguide 110. In another example embodiment, iris 160 is located in more than one location and/or in the output waveguides. Moreover, irises can be located in any suitable quantity and location of the waveguide combiner/divider to facilitate matching impedances.

Major Ridge

As mentioned above, each of waveguides 110, 120 and 130 is ridge loaded, comprising major ridges (111, 121, 131). The cross-sectional configuration of the waveguide (110, 120, 130) can vary from embodiment to embodiment. For example, waveguides 110, 120, and 130 can comprise a cross-section similar to those illustrated in any of FIGS. 2A-2E. FIG. 2A-2E, a waveguide includes cross-sectional views of example waveguides (210a-210c, 210e and 210f) of example waveguide combiners/dividers. In an example embodiment, the major ridge(s) (e.g., 211a-211f) is a cross sectional protrusion into the waveguide. The major ridge may run along a portion of the length of the waveguide in parallel with the waveguide. In one example, the protrusion has a rectangular cross section. The major ridge can include beveled corners or edges and the ridge top may be rounded.

Figure 2E:
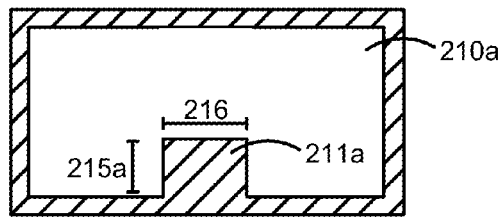
Figure 2E:
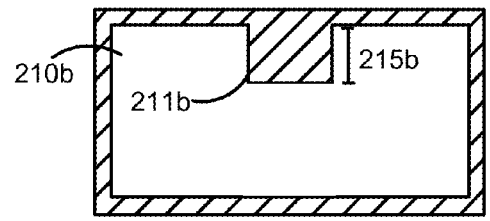
Figure 2E:
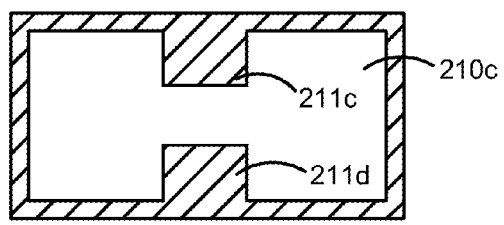
Figure 2E:
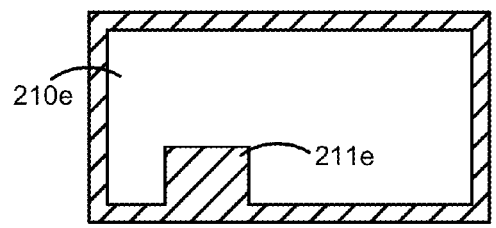
Figure 2E:
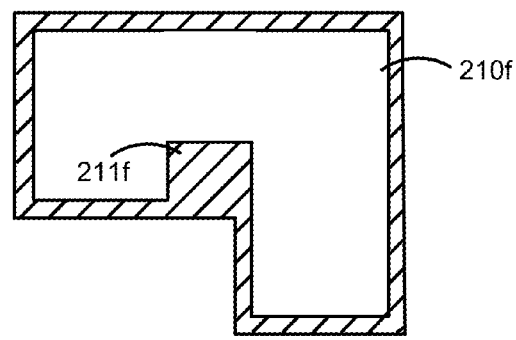
Figure 2F:
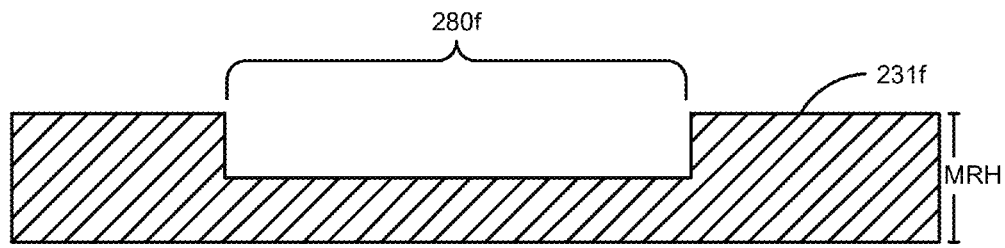

In the illustrated embodiment of FIG. 2A, a waveguide 210a comprises a major ridge 211a having a rectangular cross section. In this illustrated embodiment, major ridge 211a extends into the waveguide from a floor of a waveguide 210a a major ridge height 215a, with a major ridge width 216. In the illustrated embodiment of FIG. 2B, major ridge 211b extends into a waveguide 210b from a ceiling of waveguide 210b a major ridge height 215b. In the illustrated embodiment of FIG. 2C, waveguide 210c comprises a dual major ridge comprising a first major ridge 211d and a second major ridge 211c, wherein first major ridge 211d extends into waveguide 210c from the floor of waveguide 210c, and second major ridge 211c extends into waveguide 210c from the ceiling of waveguide 210c. In the illustrated embodiments of FIGS. 2A-2C, for example, ridges 211a-211d are centered across the width of waveguides 210a-210c, respectively. In the illustrated embodiment of FIG. 2D, however, a major ridge 211e is offset from being centered across the width of waveguide 210e. As noted above, the waveguide may have a non-rectangular cross-section. For example, in the illustrated embodiment of FIG. 2E, waveguide 210f comprises a trough waveguide, with a major ridge 211f *located at the edge of the trough.*

Major Ridge Transition Section

As mentioned above, and with reference again to the illustrated embodiment of FIGS. 1A and 1B, a third major ridge 131 is connected to major ridge junction 155 via a major ridge transition section 180. Major ridge transition section 180, in one example embodiment, is connected on one end to the first and second major ridges (111, 121) at major ridge junction 155, and connected to third major ridge 131 at the other end of major ridge transition section 180. In another example embodiment, major ridge transition section 180 is considered to be part of third major ridge 131, and third major ridge 131 is connected to the first and second major ridges (111, 121) at major ridge junction 155, with major ridge transition section 180 located near major ridge junction 155.

As discussed above, major ridge transition section 180 has a major ridge transition section height 185 within waveguide junction 150 that is less than heights (115, 125) of first major ridge 111 and second major ridge 121. Examples of major ridge transition section 180 of FIG. 1B are illustrated in FIGS. 2F-2I, showing side views of example major ridge transition sections (280f, 280g, 280h, 280i), located in third major ridge 131 (231f, 231g, 231h, 231i, respectively). In the illustrated embodiment of FIG. 2F, a major ridge transition section 280f may be considered to be a "notch" in a third major ridge 231f. Thus, third major ridge 231f comprises a major ridge transition section 280f. Stated another way, major ridge transition section 280f comprises a stepped major ridge transition from a first height to a second, lower height. The step can be a single step, or multiple steps (not shown). In an example embodiment, major ridge transition section is an E-plane jog in the height of third major ridge 231f. In another example embodiment, major ridge transition section 280f-280i has a reduced height ridge segment. The reduction in the height of third major ridge 231f-231i is a reduction of between 1%-100% of the major ridge height MRH. In this regard, in the illustrated embodiment of FIG. 2I, third major ridge 231i comprises a major ridge transition section having the MRH reduced to zero in the major ridge transition section 280i.

Figure 2G:
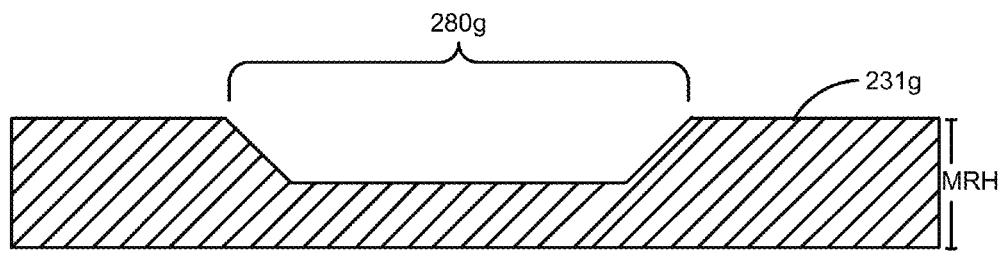
Figure 2H:
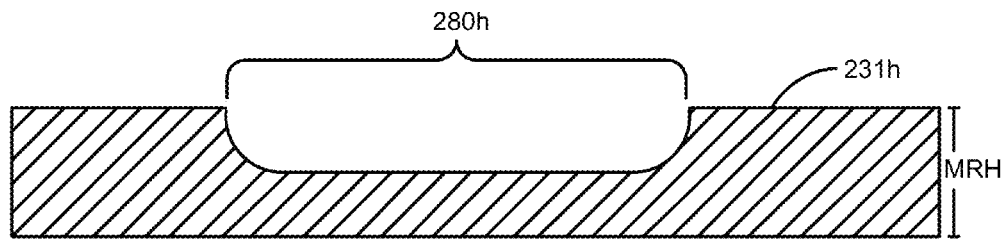
Figure 2I:
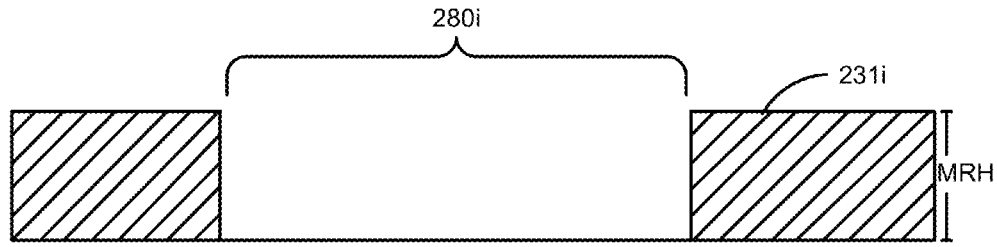

In the illustrated embodiment of FIG. 2G, third major ridge 231g comprises a linear sloped transition (or taper) to the changed height in major ridge transition section 280g. In the illustrated embodiment of FIG. 2H, third major ridge 231h comprises a curved or scooped transition to the changed height in major ridge transition section 280h. Moreover, any suitable transition shape may be used to transition from the third major ridge height outside the waveguide junction to the height of the major ridge transition section.

Major ridge transition section 280f-280i has a length measured from the beginning to the end of the major ridge transition section. In an example embodiment, this length is from the start to the end of the reduced height. The length of the major ridge transition section 280f-280i will vary from embodiment to embodiment. In some embodiments, the length ranges from 0.15a to 0.3a, where "a" is the width of the waveguide.

Minor Ridge

Figure 3B:
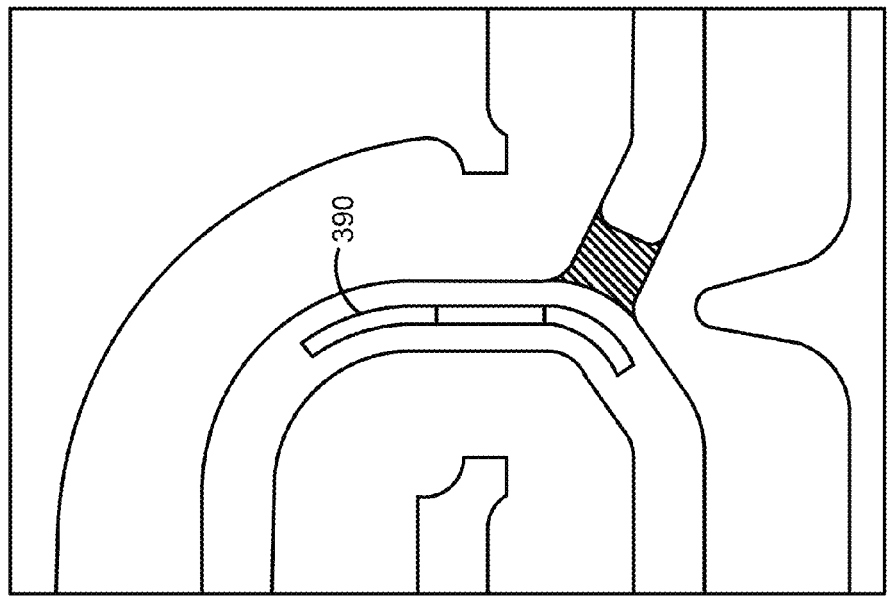
FIGS. 3C and 3D are side views of various example minor ridges.
FIGS. 3E and 3F are cross-sectional views of various example minor ridges of example waveguide combiners/dividers.
Figure 3A:
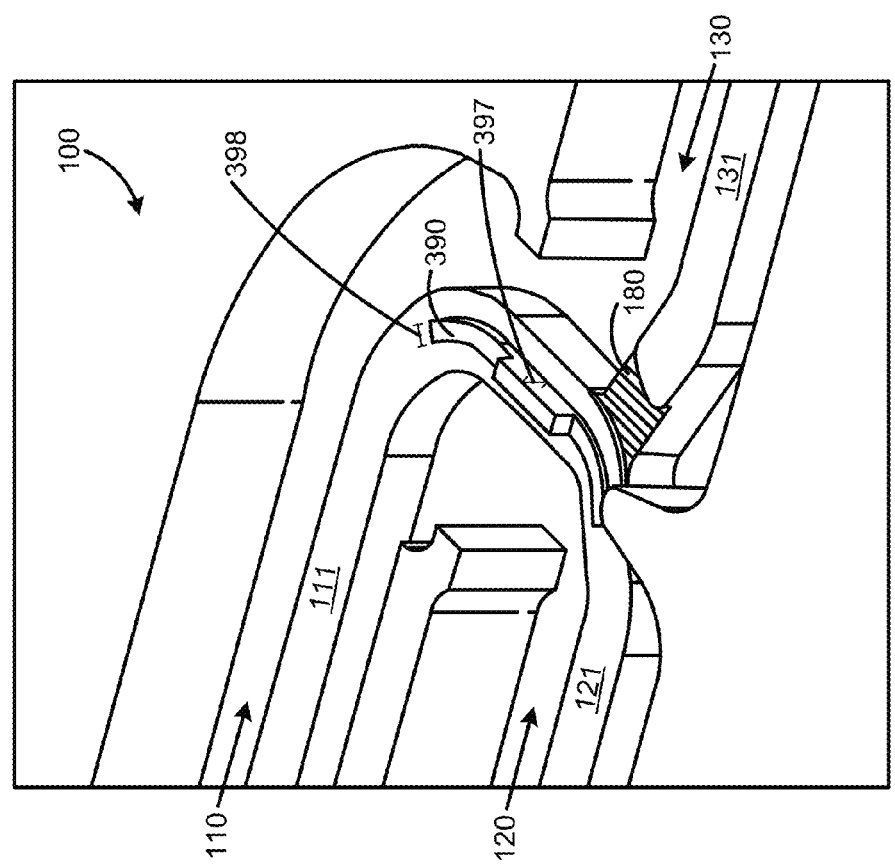

In various example embodiments, waveguide combiner/divider 100 further comprises a minor ridge on and extending between first major ridge 111 and second major ridge 121. FIGS. 3A and 3B are perspective and top views, respectively, of an example waveguide combiner/divider 100 having an example minor ridge 390. Minor ridge 390 is located on top of one or more major ridges. For example, minor ridge 390 is located on top of first major ridge 111 and second major ridge 121. Minor ridge 390 may extend down part of or all of first major ridge 111 and/or second major ridge 121. In the illustrated embodiment, minor ridge 390 extends from some portion of common waveguide 110 to some portion of a high side waveguide (e.g., 120). In the illustrated embodiment, minor ridge 390 is located on the major ridges (e.g., 111, 121) that do not have major ridge transition section 180. For example, waveguide combiner/divider 100 comprises a major ridge transition section 180 in third major ridge 131 of third waveguide 130, and minor ridge 390 runs along part of or all of the top of the major ridges (111, 121) of first waveguide 110 and second waveguide 120. Stated another way, in the illustrated embodiment, minor ridge 390 is located between the common-to-high side waveguides.

Minor ridge 390 has a minor ridge height 397. In an example embodiment, minor ridge 390 has multiple stepped sections with heights ranging from 0-0.2b, where "b" is the height of the waveguide (e.g., 110, 120). The range of heights and the number of stepped sections can depend on the amount of ridge loading (i.e. the height of the major ridge (e.g., 111, 121)). Moreover, the minor ridge height(s) 397 can be any height suitable for: wideband improved impedance matching, providing degrees of freedom for controlling phase and amplitude, as described above.

Minor ridge 390 has a minor ridge width 398. In various embodiments, minor ridge width 398 is less than the full width of the corresponding major ridge(s) (111, 121) below minor ridge 390. In other example embodiments, minor ridge width 398 is the width of the major ridge(s) (111, 121) below minor ridge 390. In this embodiment, minor ridge 390 may appear to be merely a continuation of the major ridge (111, 121), or stated another way, a bump or step-up of a portion of the major ridge(s) (111, 121).

In the illustrated embodiment of FIG. 3A, minor ridge 390 comprises more than one section. The sections of minor ridge 390 may have different heights and/or widths from each other. For example, the embodiment of FIG. 3C shows a side view of a minor ridge 394. In the illustrated embodiment, minor ridge 394 comprises a first section 391, a second section 392, and a third section 393. First section 391 may have a first height that is lower than the height of second section 392. Third section 393 may have a height that is lower than that of second section 392 but higher than that of first section 391. In the illustrated embodiment of FIG. 3D, a different minor ridge 395 comprises a first section 396 and a second section 399, where second section 399 has a height greater than that of first section 396. Moreover, minor ridge 390 can comprise any suitable number of sections, or a plurality of sections, where at least some of those sections may have a different height and/or width from that of other sections.

FIGS. 3E and 3F are cross-sectional views of various example minor ridges (390a, 390b) of example waveguide combiners/dividers. In the illustrated embodiment of FIG. 3E, minor ridge 390a comprises a rectangular cross section. However, any suitable minor ridge cross sectional shape may be used. Minor ridge 390a is located atop major ridge 311a within a waveguide 310a. In the illustrated embodiment of FIG. 3F, waveguide 310b comprises a top major ridge 311c and a bottom major ridge 311b, with minor ridge 390b on top of bottom major ridge 311b.

Method

An example method of designing the waveguide combiner/divider as described herein can include starting with desired frequency ranges and target performance values. To this can be added initial desired geometry. Then the method can further include optimizing the geometry to get the final dimension.

Figure 4:
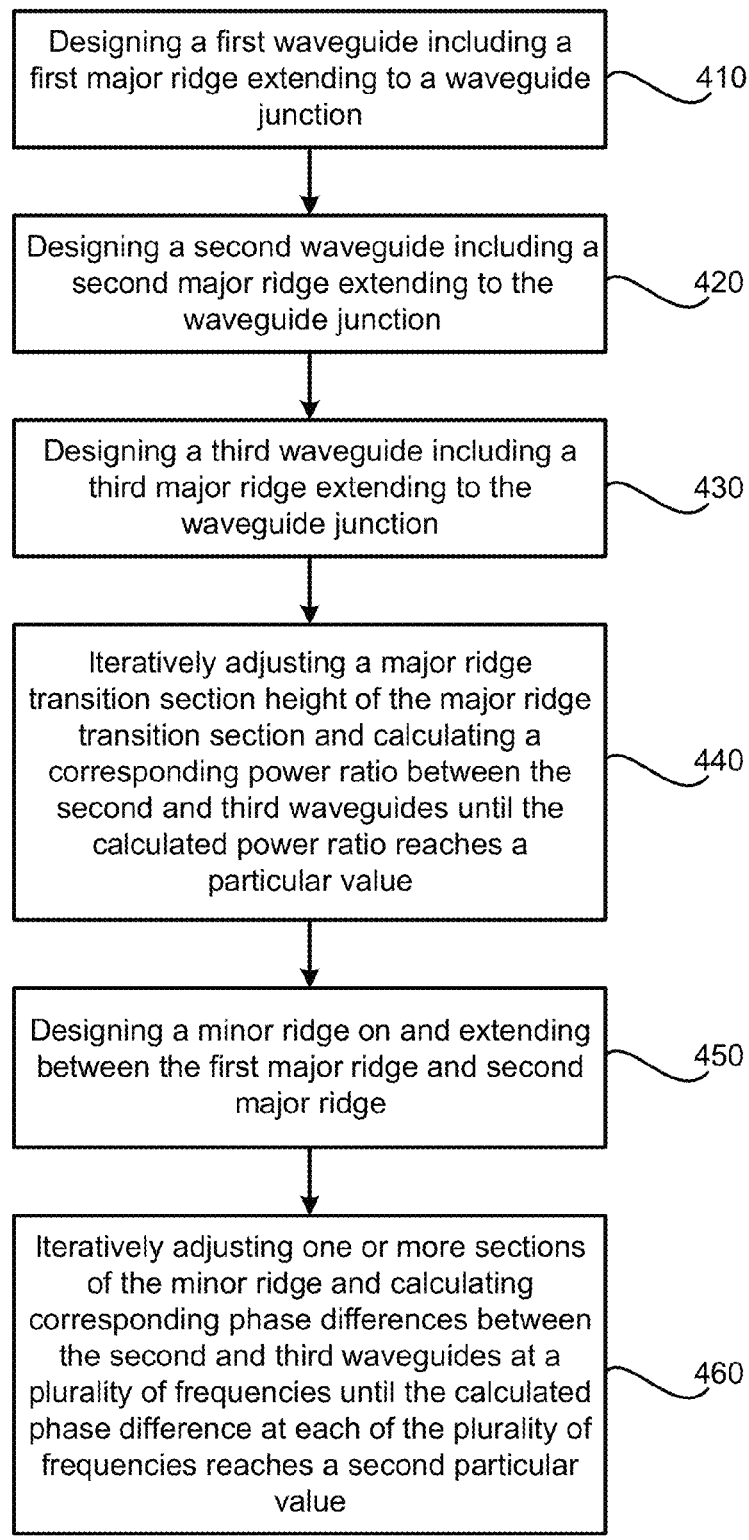
FIG. 4 is a block diagram of an example method of designing a waveguide combiner/divider.

FIG. 4 is a block diagram of an example method 400 of designing a waveguide combiner/divider. Method 400 comprises designing a first waveguide including a first major ridge extending to a waveguide junction (410). Method 400 further comprises designing a second waveguide including a second major ridge extending to the waveguide junction (420). In this embodiment, the second major ridge is connected to the first major ridge at a major ridge junction within the waveguide junction. Method 400 further comprises designing a third waveguide including a third major ridge extending to the waveguide junction (430). In this embodiment, the third major ridge is connected to the major ridge junction via a major ridge transition section. Method 400 further comprises iteratively adjusting a major ridge transition section height of the major ridge transition section and calculating a corresponding power split ratio between the second and third waveguides until the calculated power split ratio reaches a particular value (440).

The adjustments may not be only made to the major ridge section height. In an example embodiment, method 400 can further comprise adjusting features of the first, second and third waveguides within the waveguide junction while adjusting the major ridge transition section height. These features can include: the major ridge transition section length, the minor ridge height(s) and length(s), septum length and form, and the iris in the common waveguide. In an example embodiment, method 400 can further comprise iteratively adjusting features of the first, second and third waveguides and calculating corresponding phase differences between the second and third waveguides over a plurality of frequencies until the calculated phase difference at each of the plurality of frequencies reaches a second particular value. In an example embodiment, method 400 can further comprise iteratively adjusting the major ridge transition section height and calculating corresponding power split ratios between the second and third waveguides at a plurality of frequencies until the calculated power split ratio at each of the plurality of frequencies reaches a particular value.

In the illustrated embodiment of FIG. 4, method 400 can additionally comprise: designing a minor ridge on and extending between the first major ridge and second major ridge (450); and iteratively adjusting one or more sections of the minor ridge and calculating corresponding phase differences between the second and third waveguides at a plurality of frequencies until the calculated phase difference at each of the plurality of frequencies reaches a second particular value (460). A multi-parameter performance based objective function may be defined which is optimized (e.g., minimized) with constraints on individual parameters and dimensions of features of the waveguide junction. This may include parametric relationships among various features and can allow for continuous or discrete varying of the features. The method 400 may be performed using a software based design tool that may model the junction details and adjacent waveguide structures and provide parameter optimization capabilities. The waveguide combiner/divider may for example be designed using High Frequency Structure Simulator (HFSS) available from Ansys Inc. Alternatively, other software may be used to design the waveguide combiner/divider. Method 400 may be performed on a computer using such computer software to implement various parts of method 400. The computer may comprise a processor for processing digital data, a tangible, non-transitory memory coupled to the processor for storing digital data, an input device for inputting digital data, an application program stored in the memory and accessible by the processor for directing processing of digital data by the processor, a display device coupled to the processor and memory for displaying information derived from digital data processed by the processor, and one or more databases. The tangible, non-transitory memory may contain logic to allow the processor to perform the steps of method 400 to model the junction details and adjacent waveguide structures and to provide parameter optimization capabilities.

In one example embodiment, waveguide combiner/divider 100 is formed in a metal substrate. The metal substrate can be made of aluminum, copper, brass, zinc, steel, or other suitable electrically conducting material. The metal substrate can be processed to remove portions of the metal material by using: machining and/or probe electrical discharge machining (EDM). Alternative processes for forming the structures can be electroforming, casting, 3D printing, additive manufacturing, or molding. Furthermore, the substrate can be made of a dielectric or composite dielectric material that can be machined or molded or made with an additive manufacturing method and plated with an electrically conducting layer of thickness of at least approximately three skin depths at the operation frequency band.

In an example embodiment, after removing the metal material to form the waveguide pathways, a first cover is attached over a first side of the metal substrate, and a second cover is attached over the second side of the metal substrate to enclose portions of the first, second, and third waveguides. The covers can enclose and thus form rectangular waveguide pathways. The covers can comprise aluminum, copper, brass, zinc, steel, and/or any suitable metal material. The covers can be secured using screws or any suitable method of attachment. Furthermore, the cover can be made of a dielectric or composite dielectric material that can be machined, extruded or molded or made with an additive manufacturing method and plated with an electrically conducting layer of thickness of at least approximately three skin depths at the operation frequency band.

Thus, in another example embodiment, a method for making a waveguide combiner/divider comprises: forming a ridge loaded junction waveguide by removing material from one or both sides of a metal substrate to form first, second, and third waveguides, wherein the first waveguide has a common port at one end. The method further comprises forming first, second and third major ridges within the waveguides by (i) leaving major ridges when removing material to form the waveguides, or (ii) adding major ridges as part of the covers when the cover(s) are added. The waveguides may be formed using subtractive manufacturing techniques from bulk material such as aluminum sheet. Alternatively, additive manufacturing or a hybrid technique of both additive and subtractive manufacturing may be used. Laser sintering is one example of additive manufacturing. Molding techniques may also be applies. The method further comprises forming a major ridge transition section in the major ridge of the third waveguide. The method further comprises attaching one or more covers over the metal substrate to enclose portions of the first, second and third waveguides.

Beam Forming Network and Antenna

Figure 5:
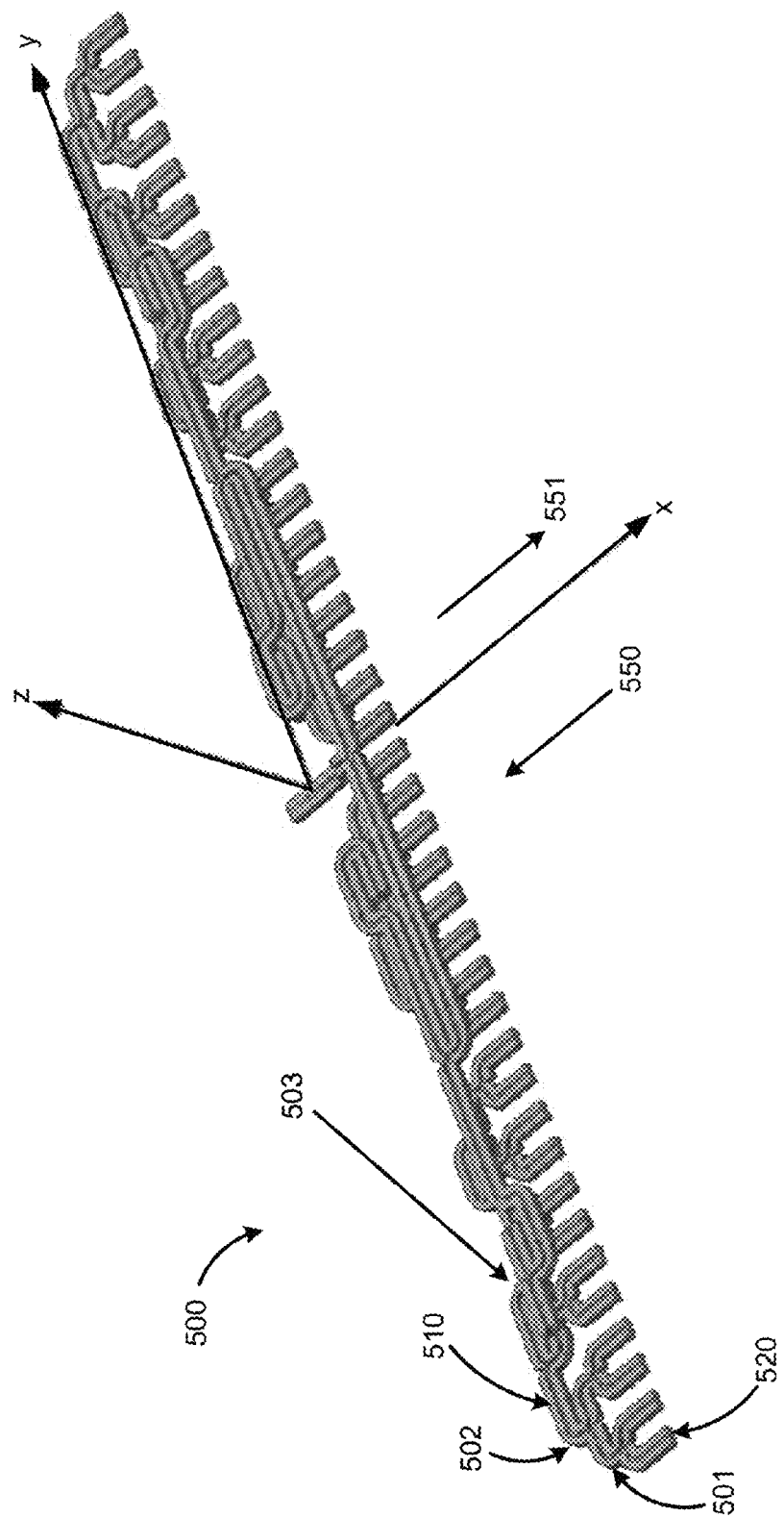
FIG. 5 is an air model of an azimuth combiner/divider comprising example waveguide combiner/dividers.

FIG. 5 is an air model of an azimuth combiner/divider comprising example waveguide combiner/dividers. Waveguide combiner/divider 100 is a building block that can be used advantageously in beam forming network (BFN) comprising multiple waveguide combiner/divider 100 building blocks. For example, a beam forming network 500 includes a first waveguide combiner/divider 501 and a second waveguide combiner/divider 502 along a signal path between a port 520 associated with a particular antenna element of an array of antenna elements and a common port 510. First waveguide combiner/divider 501 and second waveguide combiner/divider 502 are configured and coupled as described herein.

In this example embodiment, first waveguide combiner/divider 501 provides a first power split ratio, and second waveguide combiner/divider 502 provides a second power split ratio that can be different than the first power split ratio. In an example embodiment, the first power split ratio can be different than the second power split ratio due at least in part to a difference between the major ridge transition section height of the first waveguide combiner/divider 501 and the major ridge transition section height of the second waveguide combiner/divider 502.

In another example embodiment, the power distribution network is folded back on itself. For example, at least some of the waveguide combiner/divider building blocks are in a first plane, and others in the signal path are in a second plane above or below the first plane, and oriented in the opposite direction as the building blocks in the first plane. In an example embodiment, first waveguide combiner/divider 501 and second waveguide combiner/divider 502 are both in the same plane and oriented in the same direction 550 (a receive signal generally directed in a −X direction. However, a third waveguide combiner/divider 503 is on top of the plane of these two waveguide combiner/dividers (501, 502), and is oriented in a second direction 551 (such that a receive signal generally is directed in a +X direction). The folding of power distribution network 500 back on itself makes it shorter in the X axis direction. Thus, in an example embodiment, the signal path from a particular antenna element to the common port extends along a first direction 550 through the first waveguide combiner/divider 501 and extends along a second direction 551 through the third waveguide combiner/divider 503, the first direction 550 opposite the second direction 551.

In these example embodiments, each of the first, second, and third waveguide combiner/dividers (501, 502, and 503, respectively) further comprise a minor ridge on and extending between the first major ridge and second major ridge. Also, in an example embodiment, the first waveguide combiner/divider 501, the second waveguide combiner/divider 502, and the third waveguide combiner/divider 503 are each operable over a plurality of frequencies, and a ratio of a highest frequency of the plurality of frequencies to a lowest frequency of the plurality of frequencies is at least 1.5.

In various example embodiments, any suitable number of two or more waveguide combiner/divider building blocks are connected together to form a BFN. Moreover, any suitable number of waveguide combiner/divider building blocks can be in the "folded over" part or in the other plane. The number of waveguide combiner/divider building blocks is based on the number of elements in a row of the antenna array.

Figure 6:
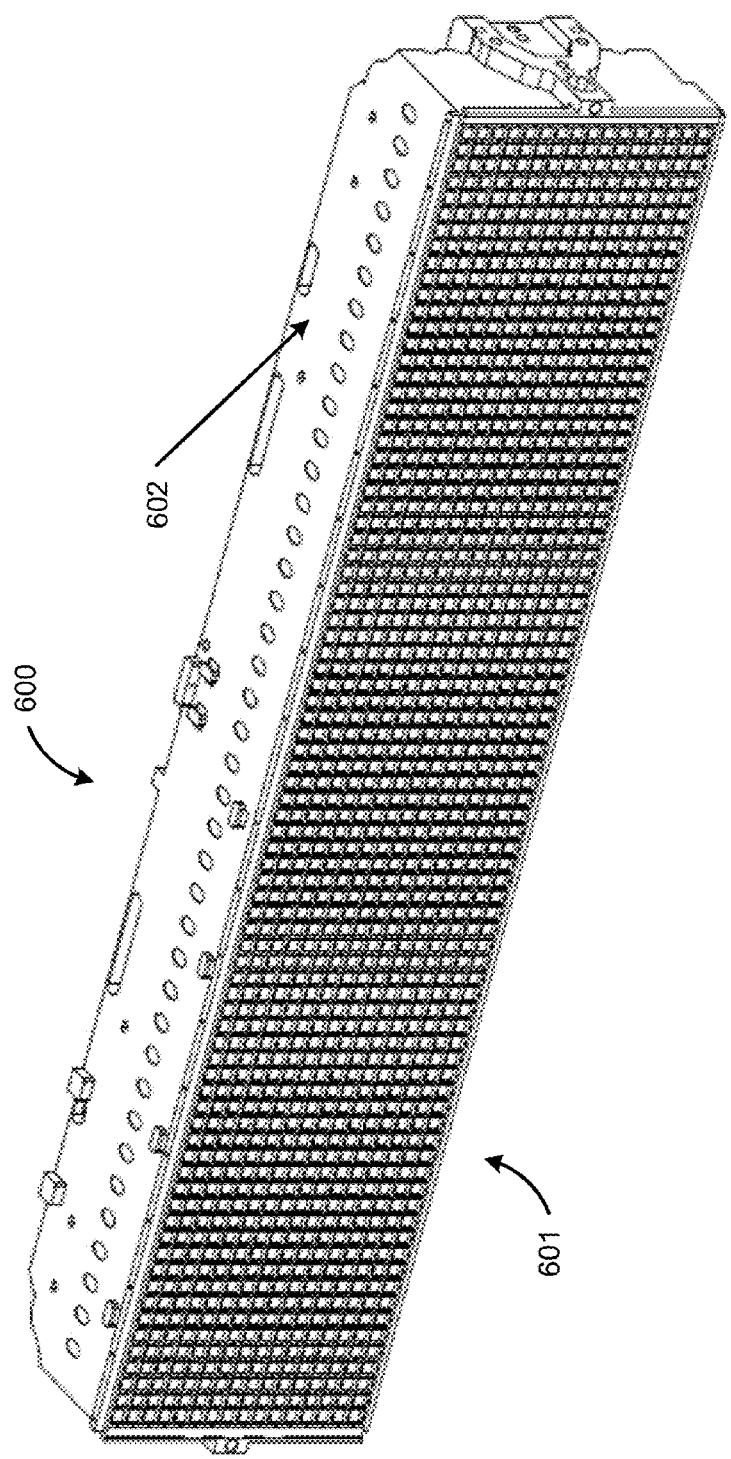
FIG. 6 is a perspective view of an antenna array comprising example waveguide combiner/dividers.

FIG. 6 is a perspective view of an antenna array comprising example waveguide combiner/dividers. In an example embodiment, an antenna 600 comprises an array of antenna elements 601 and a beam forming network 602. In an example embodiment, beam forming network 602 comprises multiple beam forming networks (such as was just described with reference to FIG. 5 and BFN 500) stacked vertically on top of each other. The beam forming network is configured to communicate signals with the array of antenna elements 601. The face of array of antenna elements 601 can be covered with, for example, an aperture close out, a protective cover, and or the like.

In an example embodiment, waveguide combiner/divider 100 is configured to facilitate Ku and Ka-band satellite communication (SATCOM) applications with advanced antenna aperture distribution functions that comply with regulations, have precise amplitude and phase control, involve simultaneous receive and transmit and dual polarized operation at diverse frequency bands, with a high level of integration to achieve compactness and light weight. In particular the embodiments disclosed herein have broader bandwidth capabilities than prior art dividers and combiners. For example, the performance of waveguide combiner/divider 100 can be acceptable over bandwidths as broad as 1.75:1 and beyond; exceeding the catalog bandwidth (1.5:1) of standard rectangular waveguide tubing.

In an example embodiment, waveguide combiner/divider 100 is configured to maintain amplitude and phase equalization across a wide or dual frequency band. It also has good input impedance match. This high degree of performance for individual junctions can be implemented in beam forming networks comprised of multiple cascaded waveguide combiner/dividers because it can facilitate achieving an overall net performance that can include precise phase and amplitude control that can be consistent over the operational bandwidth. Furthermore, the waveguide combiner/divider 100 can be capable of providing this level of performance with an unequal power split and, in an example embodiment, can maintain the power split ratio with precise control over the full bandwidth range. In other example embodiments, using the transition section height to control the power ratio facilitates the integration of multiple junctions having different power ratios.

The thin planar topology may be well suited for integration into dense multi-layer beam-forming networks in support of high performance array antennas. Together with the wideband operation it can enable the design of complex dual-polarized and dual-band feed networks in a compact form factor.

The differences between the example waveguide combiner/divider 100 and other technologies can be significant. In contrast to stripline technology, the losses can be considerably lower in the example waveguide combiner/divider 100. And interleaved waveguide network technology and magic tee divider/combiner can involve more volume than in the example waveguide combiner/divider 100. In contrast, the example waveguide combiner/divider 100 can be low loss, compact, planar, and light weight and can be implemented in dense multilayer waveguide beam forming networks. It can operate in Ka band, Ku band, X band, and or the like, in air-born and terrestrial applications.

The example waveguide combiner/divider 100 can facilitate transmitting in a first band and receiving in a second band with amplitude and phase equalization within the transmit or receive bands respectively with a wide spread between them. Various examples herein illustrate example embodiments that can have dual frequency bands of 18.3 to 20.2 GHz and 28.1 to 30.0 GHz that span an overall bandwidth of (30/18.3) 1.64:1.

In describing the present disclosure, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

It should be appreciated that the particular implementations shown and described herein are illustrative and are not intended to otherwise limit the scope of the present disclosure in any way. Furthermore, the connecting lines shown in the various figures contained herein are intended to represent exemplary functional relationships and/or physical couplings between the various elements. It should be noted that many alternative or additional functional relationships or physical connections may be present in a practical device.

It should be understood, however, that the detailed description and specific examples, while indicating exemplary embodiments of the present invention, are given for purposes of illustration only and not of limitation. Many changes and modifications within the scope of the instant invention may be made without departing from the spirit thereof, and the invention includes all such modifications. The corresponding structures, materials, acts, and equivalents of all elements in the claims below are intended to include any structure, material, or acts for performing the functions in combination with other claimed elements as specifically claimed. The scope of the invention should be determined by the appended claims and their legal equivalents, rather than by the examples given above. For example, the operations recited in any method claims may be executed in any order and are not limited to the order presented in the claims. Moreover, no element is essential to the practice of the invention unless specifically described herein as "critical" or "essential."

What is claimed is:

1. A waveguide combiner/divider comprising:
a first waveguide including a first major ridge extending to a waveguide junction; a second waveguide including a second major ridge extending to the waveguide junction, the second major ridge connected to the first major ridge at a major ridge junction within the waveguide junction; and
a third waveguide including a third major ridge extending to the waveguide junction, the third major ridge connected to the major ridge junction via a major ridge transition section, the major ridge transition section having a major ridge transition section height within the waveguide junction that is less than heights of the first major ridge, the second major ridge, and the third major ridge;
wherein a power split ratio between the second waveguide and the third waveguide is based at least in part on differences between the major ridge transition section height and the heights of the first major ridge and the second major ridge.

2. The waveguide combiner/divider of claim 1, wherein the first major ridge, second major ridge, and third major ridge have a common ridge height outside of the waveguide junction.

3. The waveguide combiner/divider of claim 1, further comprising a minor ridge on and extending between the first major ridge and the second major ridge.

4. The waveguide combiner/divider of claim 3, wherein the minor ridge comprises a plurality of sections.

5. The waveguide combiner/divider of claim 1, wherein outside the waveguide junction the first, second, and third waveguides have the same heights and have the same widths, and the first, second, and third major ridges have the same heights and have the same widths.

6. The waveguide combiner/divider of claim 1, wherein the heights of the first major ridge and the second major ridge are the same at the major ridge junction.

7. The waveguide combiner/divider of claim 6, wherein the heights of the first major ridge and the second major ridge are the same within the waveguide junction and outside the waveguide junction.

8. The waveguide combiner/divider of claim 1, wherein the waveguide junction divides an input signal in the first waveguide into a first divided signal in the second waveguide and a second divided signal in the third waveguide, the first divided signal and the second divided signal in-phase with one another at a plurality of frequencies.

9. The waveguide combiner/divider of claim 1, wherein the waveguide junction combines a first input signal in the second waveguide in-phase with a second input signal in the third waveguide at a plurality of frequencies to form an output signal in the first waveguide.

10. A method of designing a waveguide combiner/divider comprising:
designing a first waveguide including a first major ridge extending to a waveguide junction;

designing a second waveguide including a second major ridge extending to the waveguide junction, the second major ridge connected to the first major ridge at a major ridge junction within the waveguide junction;

designing a third waveguide including a third major ridge extending to the waveguide junction, the third major ridge connected to the major ridge junction via a major ridge transition section; and iteratively adjusting a major ridge transition section height of the major ridge transition section and calculating a corresponding power ratio between the second and third waveguides until the calculated power ratio reaches a particular value.

11. The method of claim 10, further comprising adjusting features of the first, second and third waveguides within the waveguide junction while adjusting the major ridge transition section height.

12. The method of claim 10, further comprising iteratively adjusting features of the first, second and third waveguides and calculating corresponding phase differences between the second and third waveguides over a plurality of frequencies until the calculated phase difference at each of the plurality of frequencies reaches a second particular value.

13. The method of claim 10, further comprising iteratively adjusting the major ridge transition section height and calculating corresponding power split ratios between the second and third waveguides at a plurality of frequencies until the calculated power split ratio at each of the plurality of frequencies reaches the particular value.

14. The method of claim 13, wherein a ratio of a highest frequency of the plurality of frequencies to a lowest frequency of the plurality of frequencies is at least 1.5.

15. The method of claim 10, wherein the first major ridge, second major ridge, and third major ridge have a common ridge height outside of the waveguide junction.

16. The method of claim 10, further comprising:
designing a minor ridge on and extending between the first major ridge and the second major ridge; and
iteratively adjusting one or more sections of the minor ridge and calculating corresponding phase differences between the second and third waveguides at a plurality of frequencies until the calculated phase difference at each of the plurality of frequencies reaches a second particular value.

17. The method of claim 10, wherein outside the waveguide junction the first, second, and third waveguides have the same heights and have the same widths, and the first, second, and third major ridges have the same heights and have the same widths.

18. An antenna comprising: an array of antenna elements; and
a beam forming network to communicate signals with the array of antenna elements, the beam forming network including a first waveguide combiner/divider and a second waveguide combiner/divider along a signal path between a particular antenna element of the array of antenna elements and a common port, wherein each of the first and second waveguide combiner/dividers comprise:
a first waveguide including a first major ridge extending to a waveguide junction; a second waveguide including a second major ridge extending to the waveguide junction, the second major ridge connected to the first major ridge at a major ridge junction within the waveguide junction; and
a third waveguide including a third major ridge extending to the waveguide junction, the third major ridge connected to the major ridge junction via a major ridge transition section, the major ridge transition section having a major ridge transition section height within the waveguide junction that is less than heights of the first major ridge, the second major ridge, and the third major ridge,
wherein a power split ratio between the second waveguide and the third waveguide is based at least in part on differences between the major ridge transition section height and the heights of the first major ridge and the second major ridge.

19. The antenna of claim 18, wherein the first waveguide combiner/divider provides a first power split ratio, and the second waveguide combiner/divider provides a second power split ratio different than the first power split ratio.

20. The antenna of claim 19, wherein the first power split ratio is different than the second power split ratio.

21. The antenna of claim 18, wherein the signal path from the particular antenna element to the common port extends along a first direction through the first waveguide combiner/divider and extends along a second direction through the second waveguide combiner/divider, the first direction opposite the second direction.

22. The antenna of claim 18, wherein each of the first and second waveguide combiner/dividers further comprise a minor ridge on and extending between the first major ridge and the second major ridge.

23. The antenna of claim 18, wherein the first waveguide combiner/divider and the second waveguide combiner/divider are each operable over a plurality of frequencies, and a ratio of a highest frequency of the plurality of frequencies to a lowest frequency of the plurality of frequencies is at least 1.5.

24. The waveguide combiner/divider of claim 1, wherein the first major ridge, the second major ridge, and the third major ridge touch and directly connect to each other.

25. The waveguide combiner/divider of claim 1, wherein a wall of each of the first waveguide, second waveguide and third waveguide is located in the same plane.

26. The waveguide combiner/divider of claim 1, wherein a cross section of each of the first waveguide, second waveguide and third waveguide is perpendicular to the same plane.

27. The antenna of claim 18, wherein the first major ridge, the second major ridge, and the third major ridge touch and directly connect to each other.

28. The antenna of claim 18, wherein a wall of each of the first waveguide, second waveguide and third waveguide is located in the same plane.

29. The antenna of claim 18, wherein a cross section of each of the first waveguide, second waveguide and third waveguide is perpendicular to the same plane.

* * * * *